(12) United States Patent
Tung

(10) Patent No.: US 6,194,772 B1
(45) Date of Patent: Feb. 27, 2001

(54) HIGH-VOLTAGE SEMICONDUCTOR DEVICE WITH TRENCH STRUCTURE

(75) Inventor: Ming-Tsung Tung, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/310,241

(22) Filed: May 12, 1999

(51) Int. Cl.[7] .............. H01L 29/00; H01L 27/01; H01L 27/12; H01L 31/0392

(52) U.S. Cl. .............. 257/501; 257/510; 257/499; 257/349; 257/513; 257/520

(58) Field of Search .............. 257/510, 513, 257/520, 387, 396, 397, 368, 501, 499, 349

(56) References Cited

U.S. PATENT DOCUMENTS

| | | | |
|---|---|---|---|
| 4,506,435 | * 3/1985 | Pliskin et al. | 29/576 W |
| 4,926,233 | * 5/1990 | Hutter | 357/43 |
| 5,291,049 | * 3/1994 | Morita | 257/335 |
| 5,350,941 | * 9/1994 | Madan | 257/647 |
| 5,859,466 | * 1/1999 | Wada | 257/508 |

FOREIGN PATENT DOCUMENTS

| | | | |
|---|---|---|---|
| 1-189173 | * 7/1989 | (JP) | 257/510 |
| 3-290961 | * 12/1991 | (JP) | 257/510 |

* cited by examiner

*Primary Examiner*—Mahshid Saadat
*Assistant Examiner*—Jesse A Fenty

(57) ABSTRACT

A structure for high-voltage semiconductor devices that have trench structure, substantially facilitating the integration of the high-voltage devices and the low-voltage devices, is disclosed. The present invention includes a semiconductor substrate and at least two dielectric regions in the substrate, one of the dielectric regions being spaced from the other of the dielectric regions by a channel region. The structure also includes at least two drift regions, each of the drift regions being adjacent to and in contact with each of the dielectric regions respectively. A gate region is formed on the substrate, wherein the gate region covers the channel region and portions of the dielectric regions. A source region adjacent to one of the dielectric region is formed, wherein the source region is spaced from the channel region by such adjacent dielectric region. A drain region adjacent to the other one of the dielectric regions is further formed, wherein the drain region is spaced from the channel region by such adjacent dielectric region.

17 Claims, 5 Drawing Sheets

HIGH-VOLTAGE SEMICONDUCTOR DEVICE WITH TRENCH STRUCTURE

BACKGROUND OF THE INVENTION

1. Field of the Invention

The present invention relates to integration of high-voltage devices and low-voltage devices, and more particularly, to high-voltage semiconductor devices having a trench structure.

2. Description of the Prior Art

As the scale of integrated circuits (ICs) has been rapidly decreased, the design and layout rule has become more stringent. Moreover, as the integrated circuits (ICs) are fabricated to be more compact, the integration of ICs with different application has become more indispensable.

FIG. 1 shows the cross section of a conventional high-voltage complimentary metal-oxide-semiconductor (HV-CMOS) transistor, which usually includes a p-type substrate 10, field oxide regions 4, an n+ source region 2, an n+ drain region 2A, a gate region 3, and an oxide layer 5. In the structure of the shown transistor, the structure of its drift region generally adopts conventional local oxidation (LOCOS) technique, which has a horizontal or lateral configuration. On the other hand, low-voltage semiconductor devices in the deep-submicron semiconductor technology (e.g., less than 0.25 micrometer) largely utilize a trench oxide structure, which has a vertical configuration, to save chip area. Accordingly, in the present semiconductor industry, the difference of the used configuration becomes a bottleneck for the integration of the high-voltage devices and the low-voltage devices. Moreover, the conventional high-voltage devices suffer current driving capability when the structure is scaled down.

For the foregoing reasons, there is a need for disclosing a structure and a method of fabricating high-voltage semiconductor devices having an improved current driving capability, and facilitating the integration with the low-voltage semiconductor devices.

SUMMARY OF THE INVENTION

In accordance with the present invention, a structure is provided for high-voltage semiconductor devices that have trench structure, substantially facilitating the integration of the high-voltage devices and the low-voltage devices. Moreover, the present invention provides a structure for improving the current driving capability of the high-voltage devices. In one embodiment, the present invention includes a semiconductor substrate having a first conductivity type, and at least two oxide regions respectively refilled in at least two trenches in the substrate, one of the oxide regions being spaced from the other of the oxide regions by a channel region. The present invention also includes a silicon oxide layer encompassing each of the oxide regions on its sidewall surface and its bottom surface. At least two drift regions having a second conductivity type opposite to the first conductivity type are formed, each of the drift regions being adjacent to and in contact with the corresponding silicon oxide layer of each of the oxide regions respectively. Further, a polysilicon gate region is formed on the substrate, wherein the polysilicon gate region covers the channel region and portions of the oxide regions. A source region having the second conductivity type adjacent to one of the oxide regions is formed, wherein the source region is spaced from the channel region by such adjacent oxide region. Further, a drain region having the second conductivity type adjacent to the other one of the oxide regions is formed, wherein the drain region is spaced from the channel region by such adjacent oxide region. Finally, the invention includes at least two implanted well regions having the second conductivity type, each of the implanted well regions being adjacent to one of the oxide regions, and each of the implanted regions being spaced from the channel region by such adjacent oxide region.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
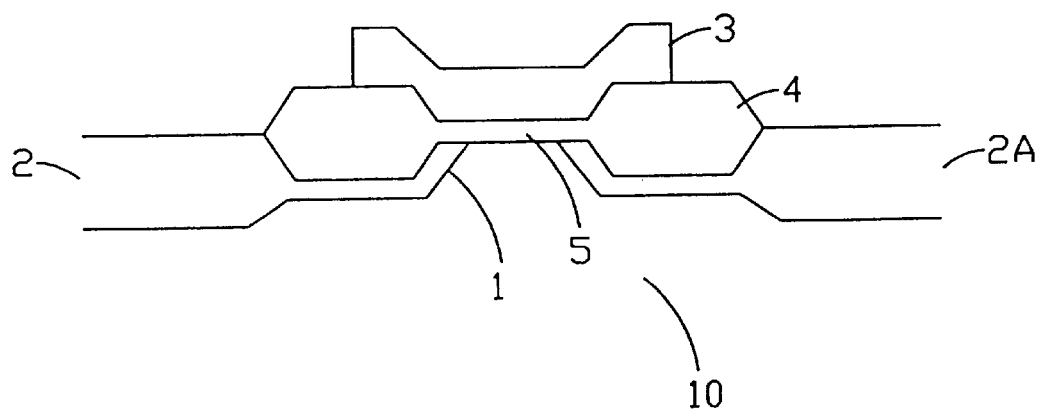
FIG. 1 shows the cross section of a conventional high-voltage complimentary metal-oxide-semiconductor (HV-CMOS) transistor.
Figure 2A:
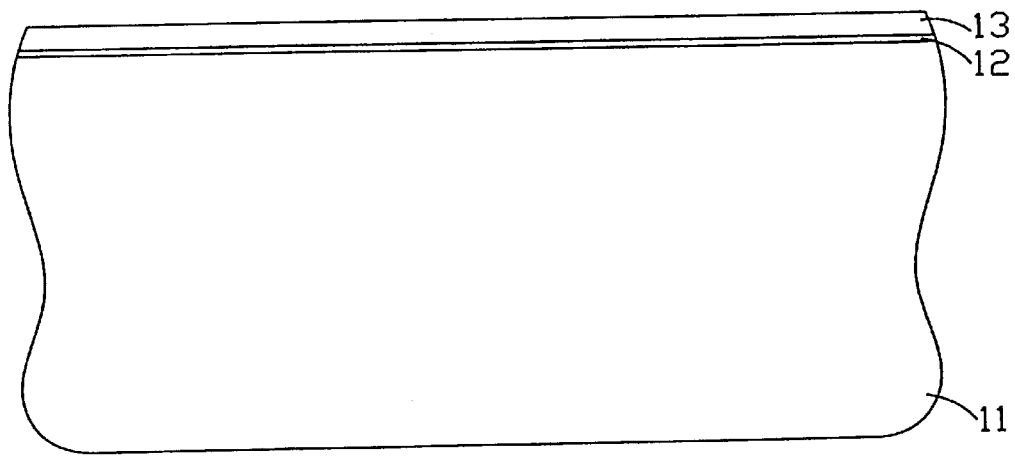
FIGS. 2A to 2G show cross-sectional views illustrative of various stages in the fabrication of a high-voltage semiconductor device in accordance with one embodiment of the present invention.

Referring to FIG. 2A, a pad oxide layer 12 having a thickness of about 100–200 angstroms is formed on a p-type silicon substrate 11. This pad oxide layer 12 is preferably formed by a conventional thermal oxidation process. A silicon nitride layer 13 is then deposited on the pad oxide layer 12. In this embodiment, the silicon nitride layer 13 is deposited by a standard low pressure chemical vapor deposition (LPCVD) technique, and has a thickness of about 1000 to 2000 angstroms. The silicon nitride layer 13 mentioned above would be used as a blocking layer in a later implantation step.

Figure 2B:
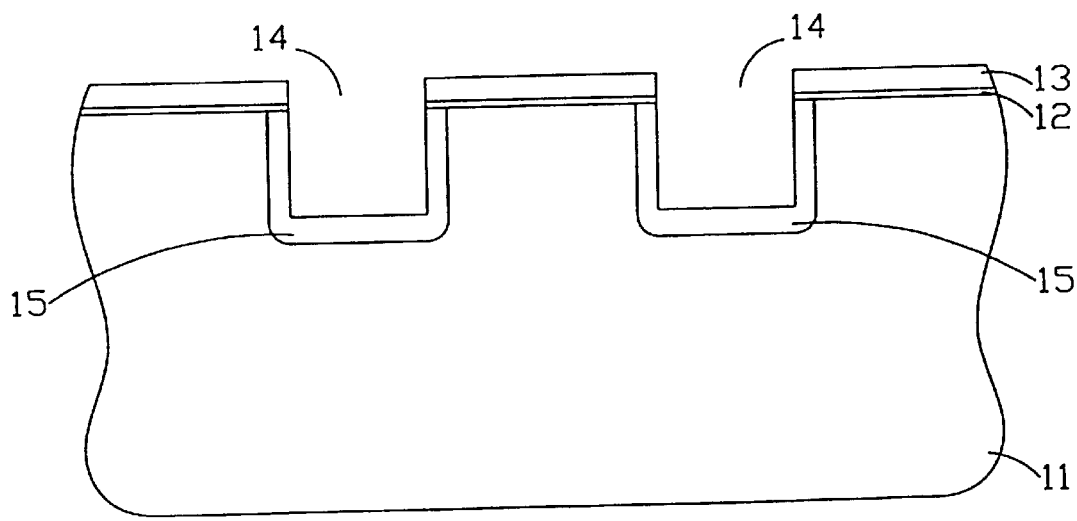

Conventional photolithography techniques are employed to define two trench areas 14 over the silicon nitride layer 13. Consequently, the silicon nitride layer 13, the pad oxide layer 12 and the substrate 11 are anisotropically etched, resulting in the structure shown in FIG. 2B.

Figure 2C:
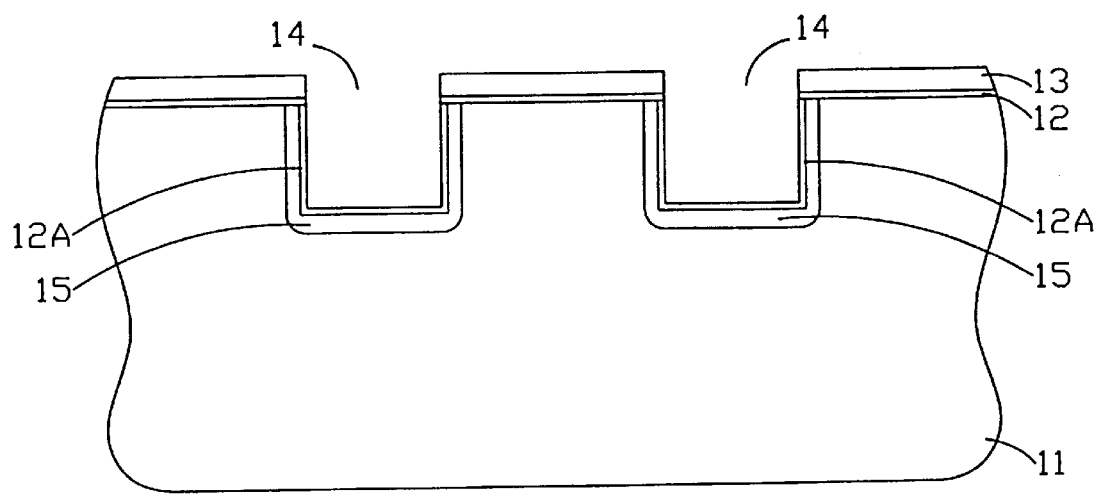

Referring to FIG. 2C, the substrate 11 is implanted with n-type ions by using the silicon nitride layer 13 as a block, thus forming drift region 15 adjacent to the sidewall and the bottom surface of the trenches 14. Next, a silicon oxide layer 12A is formed on the inner sidewall and the bottom surface of the trenches 14. The thickness of the silicon oxide layer 12A is about 100–500 angstroms.

Figure 2D:
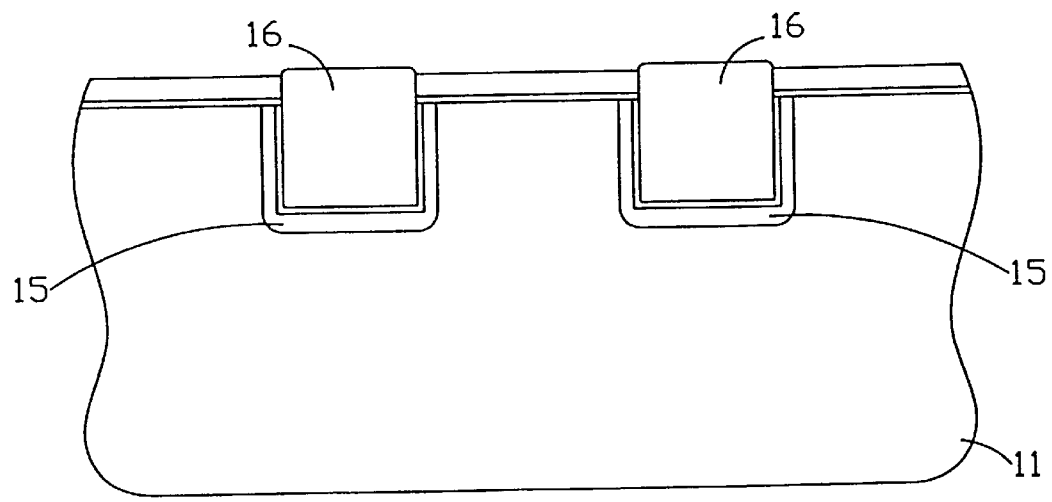
Figure 2E:
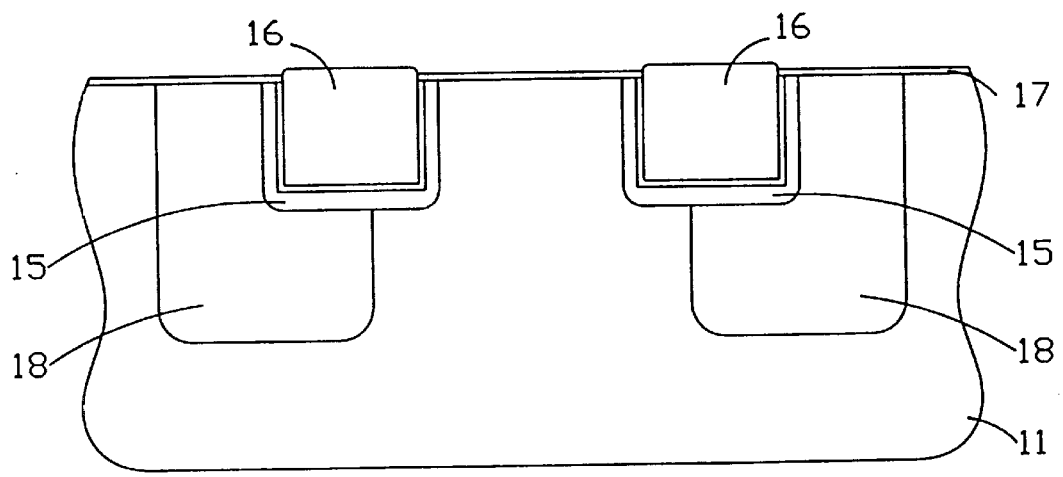

Another oxide layer 16 is further formed over the substrate 11, and therefore fills the trenches 14 (FIG. 2D). This oxide layer 16 is preferably deposited to a thickness of about 5000–9000 angstroms by a standard atmospheric pressure chemical vapor deposition (APCVD) process. The deposited oxide layer 16 is then subjected to a high temperature (about 1150° C.) treatment to be densified. Subsequently, a conventional planarization method, such as chemical mechanical polishing (CMP), is performed until the top surface of the oxide layer 16 within the trench 14 area is substantially level with the top surface of the silicon nitride layer 13.

After the silicon nitride layer 13 and the silicon oxide layer 12 are removed by a conventional method, an oxide layer 17 having a thickness of about 100–200 angstroms is further thermally grown on the surface of the substrate 11. Conventional photolithography techniques are then employed to define two well areas, followed by n-type ion implantation and standard annealing process. Therefore, two n-well regions 18 are thus generated. Specifically, each of the well regions 18 is adjacent to its nearby filled oxide region 16, and is spaced from the channel region (i.e., the region between the two filled oxide regions 16) by the nearby oxide region 16.

Figure 2F:
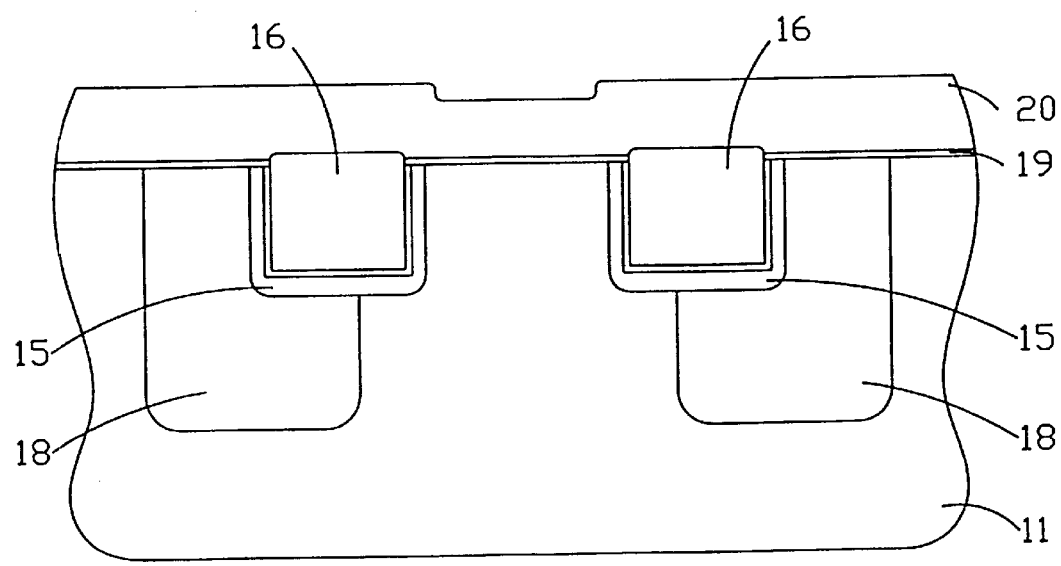

After the oxide layer 17 is removed by a conventional etch method, a gate oxide layer 19 and an n-doped polysilicon layer 20 are then formed on the substrate 11 as shown in FIG. 2F. In this embodiment, the gate oxide layer 19 has a thickness of about 2000–3000 angstroms, and is preferably formed by a conventional low-pressure chemical vapor deposition (LPCVD).

Figure 2G:
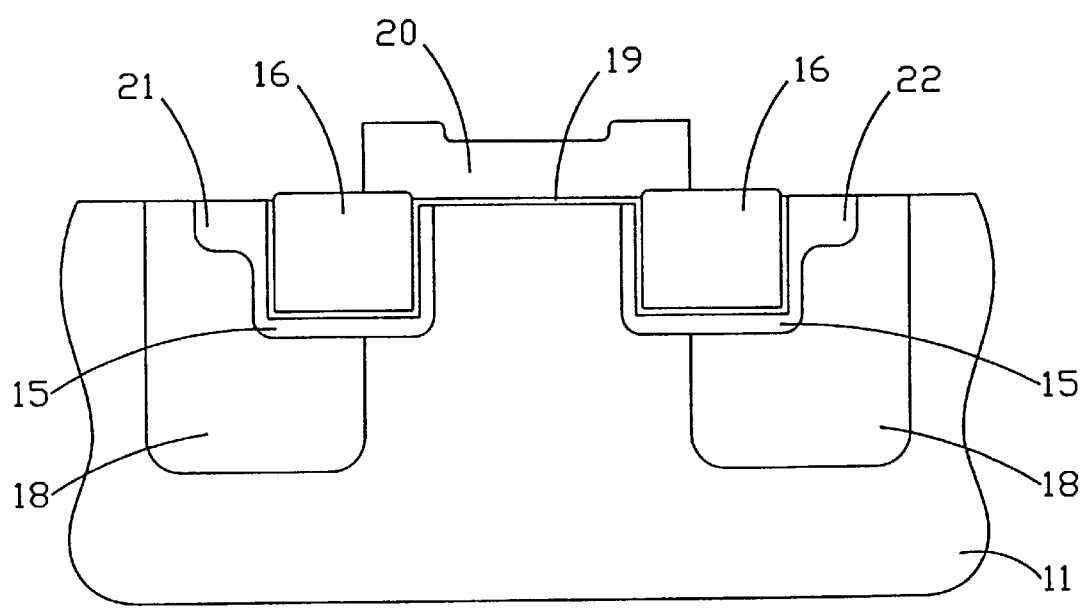

Finally, referring to FIG. 2G, other photolithography techniques are employed to define source 21/drain 22 regions. After performing n-type ion implantation, a source region 21 and a drain region 22 are thus achieved. Specifically, each of the source/drain regions is adjacent to its nearby filled oxide region 16, and is spaced from the channel region by said nearby filled oxide region 16. Particularly, the concentration of the source 21/drain 22 regions is higher than that of the drift regions 15. In this embodiment, the source 21/drain 22 regions have concentration of about $8E19/cm^3$, while the drift regions 15 have concentration of about $6E16/cm^3$.

According to the present invention, the drift regions 15 of the fabricated semiconductor device, particularly of a high-voltage device, have the length equal to the total length encompassing the sidewall and the bottom of the trenches 14. Therefore, the operating voltage of the fabricated device is substantially increased due to the enlarged drift length. Furthermore, two n-wells 18 are also formed in the fabricated device to improve current driving capability, thus making the integration of the high- and low-voltage devices possible in a deep-submicron semiconductor technology.

It is further noted that the vertical-oriented drift region in the present invention consumes less chip area than the horizontal-oriented rift region in the prior art, thus making the integrated circuits denser.

Although specific embodiments have been illustrated and described, it will be obvious to those skilled in the art that various modifications may be made without departing from what is intended to be limited solely by the appended claims.

What is claimed is:

1. A semiconductor device, comprising:
   a semiconductor substrate having a first conductivity type;
   at least two oxide regions respectively refilled in at least two trenches in said substrate, one of said oxide regions being spaced from the other of the oxide regions by a channel region, said channel region having a surface;
   a silicon oxide layer encompassing each of said oxide regions on its sidewall surface and its bottom surface, said silicon oxide layer further formed on said surface of said channel region;
   at last two drift regions having a second conductivity type opposite to the first conductivity type, each of said drift regions being adjacent to and in contact with each of said dielectric regions respectively;
   a gate region formed on said substrate, said gate region covering said channel region and portions of said dielectric regions;
   a source region having the second conductivity type adjacent to one of said dielectric regions, said source region being spaced from said channel region by such adjacent dielectric region; and
   a drain region having the second conductivity type adjacent to the other one of said dielectric regions, said drain region being spaced from said channel region by such adjacent dielectric region.

2. The device according to claim 1, wherein said semiconductor substrate comprises silicon.

3. The device according to claim 1, wherein said dielectric regions comprise silicon oxide.

4. The device according to claim 1, further comprising at least two implanted regions having the second conductivity type, each of said implanted regions being adjacent to one of said dielectric regions, and each of said implanted regions being spaced from the channel region by such adjacent dielectric region.

5. The device according to claim 4, wherein said two implanted regions promote the driving force of said semiconductor device.

6. The device according to claim 1, wherein said gate region comprises polysilicon.

7. The device according to claim 1, wherein said first conductivity type is p-conductivity type and said second conductivity type is n-conductivity type.

8. A semiconductor device, comprising:
   a semiconductor substrate having a first conductivity type;
   at least two oxide regions respectively refilled in at least two trenches in said substrate, one of said oxide regions being spaced from the other of the oxide regions by a channel region;
   a silicon oxide layer encompassing each of said oxide regions on its sidewall surface and its bottom surface, said silicon oxide layer further formed on surface of the channel region;
   at least two drift regions having a second conductivity type opposite to the first conductivity type, each of said drift regions being adjacent to and in contact with the corresponding silicon oxide layer of each of said oxide regions respectively;
   a polysilicon gate region formed on said substrate, said polysilicon gate region covering the channel region and portions of said oxide regions;
   a source region having the second conductivity type adjacent to one of said oxide regions, said source region being spaced from the channel region by such adjacent oxide region;
   a drain region having the second conductivity type adjacent to the other one of said oxide regions, said drain region being spaced from the channel region by such adjacent oxide region; and
   at least two implanted well regions having the second conductivity type, each of said implanted well regions being adjacent to one of said oxide regions, and each of said implanted regions being spaced from the channel region by such adjacent oxide region.

9. The device according to claim 8, wherein said semiconductor substrate comprises silicon.

10. The device according to claim 8, wherein said first conductivity type is p-conductivity type and said second conductivity type is n-conductivity type.

11. The device according to claim 8, wherein said drift regions have doping concentration lower than doping concentration of said source region or drain region.

12. The device according to claim 8, wherein each of said oxide regions has a thickness of about 5000–9000 angstroms.

13. The device according to claim 8, wherein said oxide regions are formed by atmospheric pressure chemical vapor deposition (APCVD).

14. The device according to claim 8, wherein top surface of said oxide regions is substantially level with top surface of said substrate.

15. The device according to claim 8, wherein said silicon oxide layer has a thickness of about 100–500 angstroms.

16. The device according to claim 8, wherein said two implanted regions promote the driving force of said semiconductor device.

17. A semiconductor device, comprising:

a semiconductor substrate having a first conductivity type;

at least two oxide regions respectively refilled in at least two trenches in said substrate, one of said oxide regions being spaced from the other of the oxide regions by a channel region;

a silicon oxide layer encompassing each of said oxide regions on its sidewall surface and its bottom surface, said silicon oxide layer further formed on surface of the channel region;

at least two drift regions having a second conductivity type opposite to the first conductivity type, each of said drift regions being adjacent to and in contact with the corresponding silicon oxide layer of each of said oxide regions respectively;

a polysilicon gate region formed on said substrate, said polysilicon gate region covering the channel region and portions of said oxide regions;

a source region having the second conductivity type adjacent to one of said oxide regions, said source region being spaced from the channel region by such adjacent oxide region;

a drain region having the second conductivity type adjacent to the other one of said oxide regions, said drain region being spaced from the channel region by such adjacent oxide region; and at least two implanted well regions having the second conductivity type, each of said implanted well regions being adjacent to one of said oxide regions, and each of said implanted regions being spaced from the channel region by such adjacent oxide region, wherein said two implanted regions promote the driving force of said semiconductor device.

* * * * *